(12) United States Patent
Hatanaka et al.

(10) Patent No.: US 10,461,045 B2
(45) Date of Patent: Oct. 29, 2019

(54) POWER SEMICONDUCTOR DEVICE

(71) Applicant: Mitsubishi Electric Corporation, Chiyoda-ku (JP)

(72) Inventors: Yasumichi Hatanaka, Chiyoda-ku (JP); Kozo Harada, Chiyoda-ku (JP); Hiroyuki Harada, Chiyoda-ku (JP); Takashi Nishimura, Chiyoda-ku (JP); Masayuki Mafune, Chiyoda-ku (JP); Koji Yamada, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/776,173

(22) PCT Filed: Jul. 1, 2016

(86) PCT No.: PCT/JP2016/069596
§ 371 (c)(1),
(2) Date: May 15, 2018

(87) PCT Pub. No.: WO2017/090267
PCT Pub. Date: Jun. 1, 2017

(65) Prior Publication Data
US 2019/0267331 A1 Aug. 29, 2019

(30) Foreign Application Priority Data
Nov. 27, 2015 (JP) .................. 2015-231875

(51) Int. Cl.
*H01L 23/00* (2006.01)
*H01L 23/043* (2006.01)
(Continued)

(52) U.S. Cl.
CPC .......... *H01L 23/562* (2013.01); *H01L 23/043* (2013.01); *H01L 23/24* (2013.01);
(Continued)

(58) Field of Classification Search
CPC . H01L 23/562; H01L 25/072; H01L 23/3735; H01L 24/48; H01L 23/043; H01L 23/24; H01L 23/3672; H01L 2224/48155
See application file for complete search history.

(56) References Cited

U.S. PATENT DOCUMENTS

| 5,332,795 A | 7/1994 | Fujiki et al. |
| 2014/0319669 A1 | 10/2014 | Kimijima et al. |

FOREIGN PATENT DOCUMENTS

| JP | 5-70693 A | 3/1993 |
| JP | 11-40703 A | 2/1999 |

(Continued)

OTHER PUBLICATIONS

International Search Report dated Aug. 30, 2016 in PCT/JP2016/069596 filed Jul. 1, 2016.

*Primary Examiner* — Anthony Ho
(74) *Attorney, Agent, or Firm* — Oblon, McClelland, Maier & Neustadt, L.L.P.

(57) ABSTRACT

A power semiconductor device including an insulating substrate having a metal layer formed on an upper surface thereof, a semiconductor element and a main electrode bonded to the metal layer, a metal wire connecting the metal layer with the semiconductor element, a metal member bonded to a lower surface side of the insulating substrate, a case member surrounding the insulating substrate and being in contact with a surface of the metal member bonded to the insulating substrate, and a sealing resin which fills a region surrounded by the metal member and the case member and has a resin strength of 0.12 MPa or higher at room temperature, a microcrystallization temperature of −55° C. or lower, and a needle penetration of 30 to 50 after storage at 175° C. for 1000 hours and seals the insulating substrate, the metal layer, the semiconductor element, the metal wire, and the main electrode.

15 Claims, 1 Drawing Sheet

(51) Int. Cl.
    *H01L 23/24*     (2006.01)
    *H01L 23/373*     (2006.01)
    *H01L 25/07*     (2006.01)
    *H01L 23/367*     (2006.01)

(52) U.S. Cl.
    CPC ...... *H01L 23/3672* (2013.01); *H01L 23/3735* (2013.01); *H01L 24/48* (2013.01); *H01L 25/072* (2013.01); *H01L 2224/48155* (2013.01)

(56) References Cited

FOREIGN PATENT DOCUMENTS

| | | |
|---|---|---|
| JP | 11-269387 A | 10/1999 |
| JP | 2014-216558 A | 11/2014 |

POWER SEMICONDUCTOR DEVICE

TECHNICAL FIELD

The present invention relates to a silicone gel-sealed power semiconductor device.

BACKGROUND ART

Semiconductor elements having conducting paths in a vertical direction of the elements for the purpose of coping with high voltage and large current are generally called power semiconductor elements (for example, IGBTs (Insulated Gate Bipolar Transistors), MOSFETs (Metal Oxide Semiconductor Field Effect Transistors), bipolar transistors, and diodes). A power semiconductor device including a power semiconductor element mounted on a circuit board and packaged with a sealing resin is used in a wide variety of fields including industrial equipment, automobiles, and railways. With the recent increased performance of equipment provided with power semiconductor devices, there is an increasing demand for increasing performance of power semiconductor devices, such as increasing rated voltage and rated current, and increasing the use temperature range (higher temperatures, lower temperatures).

The package structures of power semiconductor devices are mainly case structures. In a power semiconductor device having a case structure, a power semiconductor element is mounted on a heatsink base plate with an insulating substrate interposed, and a case is bonded to the base plate. The power semiconductor element mounted in the inside of the power semiconductor device is connected to a main electrode. The power semiconductor element and the main electrode are connected using a bonding wire. For the purpose of preventing insulation failure during application of high voltage, an insulative gel-like filler, such as a silicone gel, is typically used as a sealing resin for power semiconductor devices.

In a conventional power semiconductor device, the semiconductor element in the case is sealed or filled with a silicone gel. The loss modulus of the silicone gel at 25° C. at shear frequency of 0.1 Hz is $1.0 \times 10^3$ to $1.0 \times 10^5$ dyne/cm$^2$, and the complex modulus thereof is $1.0 \times 10^6$ dyne/cm$^2$ or less (see PTD 1 below).

CITATION LIST

Patent Document

PTD 1: Japanese Patent Laying-Open No. 11-40703 (page 3, FIG. 1)

SUMMARY OF INVENTION

Technical Problem

Power semiconductor devices have been used in a wider use temperature range (higher temperatures, lower temperatures). In order to be adapted to higher power density of power semiconductor devices, it is essential to achieve high-temperature operation of power semiconductor elements. Power semiconductor elements have shifted from the conventional 150° C. operation to the 175° C. operation. In view of the environment-resistant characteristic under the expanding use environment of power semiconductor devices, there is a growing demand for the use in an extremely low temperature environment as low as −55° C. The reliability of power semiconductor devices should be ensured in this expanded use temperature range of −55° C. to 175° C.

A temperature cycle test in a temperature range of −55° C. on the low temperature side to 175° C. on the high temperature side is performed as an accelerated test for confirming the reliability of a power semiconductor device in the temperature range of −55° C. to 175° C. In the power semiconductor device sealed in a silicone gel, however, the silicone gel sealing material may crack in the temperature cycle test or high temperature storage test, leading to reduction of insulation reliability. In particular, when a large semiconductor device, for example, for trains undergoes a temperature cycle test in a temperature range of −55° C. on the low temperature side to 175° C. on the high temperature side, the silicone gel sealing material may crack due to large thermal stress resulting from the difference in thermal expansion coefficient between the silicone gel with a large thermal expansion coefficient and each member of the power semiconductor device. This may reduce the insulation reliability.

The present invention is made in order to solve the problem above and provides a silicone gel-sealed power semiconductor device, in which heat resistance and reliability can be improved by suppressing cracking of a silicone gel sealing material.

Solution to Problem

A power semiconductor device according to the present invention includes an insulating substrate having a metal layer formed on an upper surface of the insulating substrate, a semiconductor element and a main electrode each bonded to an upper surface of the metal layer, a metal wire connecting the metal layer and the semiconductor element, a metal member bonded to a lower surface side of the insulating substrate, a case member surrounding the insulating substrate and being in contact with a surface of the metal member that is bonded to the insulating substrate, and a sealing resin filled in a region surrounded by the metal member and the case member. The sealing resin has a resin strength equal to or higher than 0.12 MPa at room temperature, a microcrystallization temperature equal to or lower than −55° C., and a needle penetration of 30 to 50 after storage at 175° C. for 1000 hours. The sealing resin seals the insulating substrate, the metal layer, the semiconductor element, the metal wire, and the main electrode.

Advantageous Effects of Invention

The present invention can suppress cracking of a silicone gel sealing material in a temperature cycle test and a high temperature storage test for power semiconductor devices and provides a power semiconductor device with high heat resistance and reliable.

DESCRIPTION OF EMBODIMENTS

First Embodiment

Figure 1:
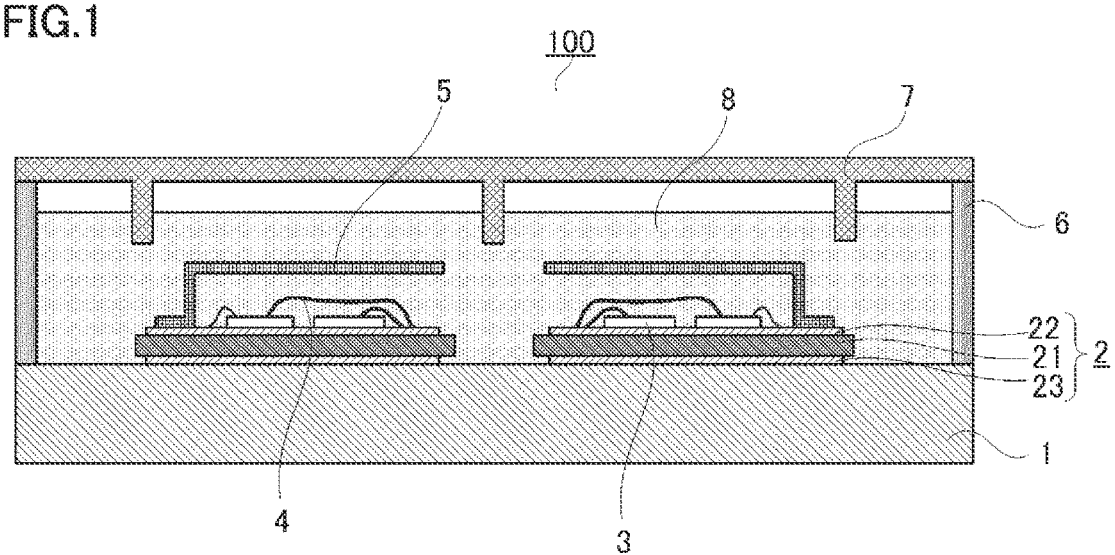
FIG. 1 is a schematic diagram illustrating a cross-sectional structure of a power semiconductor device in a first embodiment of the present invention.

FIG. 1 is a schematic diagram illustrating a cross-sectional structure of a power semiconductor device in a first embodiment of the present invention. In the figure, a power semiconductor device 100 includes a base plate 1 as a metal member, an insulating substrate 2, a chip 3 as a semiconductor element, a bonding wire 4 as metal wiring, a main electrode 5, a case member 6, a cover 7 as a cover member, and silicone gel 8 as sealing resin.

As illustrated in FIG. 1, insulating substrate 2 is bonded to base plate 1 with solder (not illustrated), and chip 3 is bonded on insulating substrate 2 with solder (not illustrated). Chip 3 is wired through bonding wire 4, and main electrode 5 is wired on insulating substrate 2 with solder (not illustrated). Case 6 is affixed to base plate 1 with an adhesive (not illustrated), and cover 7 is affixed to case 6 with an adhesive (not illustrated). Furthermore, insulating substrate 2, chip 3, bonding wire 4, and main electrode 5 disposed in a region surrounded by base plate 1 and case 6 is sealed with silicone gel 8.

For example, aluminum and aluminum alloy, copper and copper alloy, and a composite material of aluminum and ceramics, such as AlSiC, can be used for base plate 1. Specifically, copper and copper alloy are preferred in terms of thermal conductivity, and an AlSiC composite material is more preferred in terms of light weight and low thermal expansion.

Insulating substrate 2 includes metal conductor layers 22 and 23 formed on both surfaces of a ceramic plate 21. For example, silicon nitride (SN), aluminum nitride (AlN), and alumina, and Zr-containing alumina can be used for ceramic plate 21. Specifically, MN and SN are preferred in terms of thermal conductivity, and SN is more preferred in terms of material strength. Insulating substrate 2 is bonded on base plate 1 using solder. Sintered silver or a liquid-phase diffusion material can be applied as a bonding material, instead of solder. On base plate 1, a single insulating substrate 2 may be bonded or a plurality of insulating substrates 2 may be used depending on, for example, current density.

For example, metals excellent in electrical conductivity and thermal conductivity, such as aluminum and aluminum alloy, and copper and copper alloy can be used for conductor layers 22 and 23. Specifically, copper is preferably used in view of heat conduction and electrical conduction.

Chip 3 may be bonded on insulating substrate 2 using sintered silver or a liquid-phase diffusion material, instead of solder. Sintered silver and the liquid-phase diffusion material have a melting temperature higher than solder material and enable increase of the operating temperature of the power semiconductor device. Sintered silver has thermal conductivity better than solder and therefore improves heat dissipation of the chip, thereby improving the reliability. The liquid-phase diffusion material can be bonded under lower load compared with sintered silver and therefore has excellent processability, thereby preventing damage to the chip due to bonding load.

Aluminum and aluminum alloy, and copper and copper alloy can be used for bonding wire 4.

Main electrode 5 is, for example, a copper plate with a thickness of 1.0 mm processed into a predetermined shape by etching or punching.

A molded product of thermoplastic resin, such as PET (Poly Ethylene Terephthalate)-PBT (Poly Butylene Terephtalate), PPS (Poly Phenylene Sulfide), and liquid crystal polymer can be used for case 6 and cover 7. Specifically, PPS is preferred in terms of insulating properties and flame retardancy, and liquid crystal polymer is preferred in terms of heat resistance. Case 6 is disposed around the entire outer periphery of base plate 1 so as to surround insulating substrate 2. When a plurality of insulating substrates 2 are present, case 6 collectively surrounds a plurality of insulating substrates 2. Case 6 is affixed to base plate 1 using an adhesive or the like.

Silicone gel 8 is an addition reaction-type silicone composed of the vinyl group of a methylvinylsiloxane polymer and a methylhydrogen polymer. The addition reaction-type silicone gel is preferred in view of short-time curing, curing reaction free from byproducts such as water and alcohol, and insulation reliability.

In power semiconductor device 100, eight insulating substrates 2 each having a size of 5.7 cm×4.8 cm are bonded on base plate 1 having an outer shape of 25 cm×14 cm. Case 6 has a height of 4.5 cm, and 2.7 cm-thick silicone gel 8 is sealed in case 6.

Cover 7 has a grid-like protrusion, and the protrusion is partially embedded in silicone gel 8. Since power semiconductor device 100 is large and the sealing thickness of silicone gel 8 is large, silicone gel 8 significantly vibrates per se in a vibration test. The vibration of silicone gel 8 itself causes a failure of breakage of bonding wire 4. For this reason, the grid-like protrusion formed at cover 7 is inserted into silicone gel 8 to fix silicone gel 8. This reduces vibration of silicone gel 8 and prevents breakage of bonding wire 4. The grid-like protrusion may be eliminated if the size of power semiconductor device 100 is not large and vibration of silicone gel 8 is negligible.

The characteristics of the cured product of silicone gel 8 used for sealing power semiconductor device 100 were measured by the following method.

The needle penetration of cured silicone gel 8 was determined using a ¼ cone (9.38 g) of an automatic needle penetration tester (RPN-201 manufactured by RIGO CO., LTD.). The measurement method is compliant with JIS-K2235 (consistency test). The distance of penetration of the ¼ cone into the silicone gel for five seconds was measured, where 0.1 mm was one unit. Cured silicone gel 8 with a thickness of 20 mm produced in a glass petri dish with a diameter of 70 mm was used as a measurement sample. As is understood from the measurement method, the needle penetration is a measurement value indicating the hardness of silicone gel 8. When silicone gel 8 undergoes thermal hysteresis in a temperature cycle test or a high temperature storage test, silicone gel 8 hardens, causing hardening deterioration. When hardening deterioration proceeds and silicone gel 8 hardens (the value of needle penetration becomes small), silicone gel 8 becomes brittle, leading to cracking of silicone gel 8. In this evaluation, in the initial stage, the needle penetration at 175° C. after a predetermined time was measured and used as an index of hardening deterioration of cured silicone gel 8. Here, high temperature refers to the maximum value (upper limit) on the high temperature side of the use temperatures of the power semiconductor device. High temperature storage refers to storage at the temperature on the high temperature side. As used in the present description, the use temperatures of the power semiconductor device refer to the use temperatures (temperature range) defined in the design specifications of the power semiconductor device, rather than the temperatures during actual use of the power semiconductor device.

Another example of the index indicating the hardness of cured silicone gel 8, other than needle penetration, is a loss modulus measured by the parallel plates process in a viscoelasticity measurement apparatus.

The frequency of loss modulus measurement in the parallel plates process in the viscoelasticity measurement apparatus is 0.1 Hz to 1.0 Hz. Since the frequency is expressed by the following formula: frequency f(Hz)=1/T(sec), 0.1 Hz to 1.0 Hz means the modulus measurement in a cycle of 1 to 10 seconds. The actual temperature cycle test is performed in a two-hour cycle of holding for one hour on each of the low temperature side and the high temperature side, and the test with about 0.000069 Hz (=1/14400 sec) is conducted. Since the loss modulus of the cured silicone gel varies depending on the measurement frequency, the elastic modulus at extremely low frequencies in the temperature cycle test conditions or the actual use conditions deviates from the loss modulus measurement value in the parallel plates process in the viscoelasticity measurement apparatus.

In the measurement, a sample shaped in a small disk with a diameter of 20 mm and a thickness of 5 to 6 mm is usually used. In the actual power semiconductor device, silicone gel 8 is injected and cured in the space formed with case 6 and base plate 1. Since the hardening deterioration of silicone gel 8 proceeds under the influence of oxygen in the air, a significant difference arises between the disc-shaped silicone gel 8 sample alone and silicone gel 8 surrounded by case 6 and base plate 1 of the power semiconductor device. On the other hand, the sample for measuring needle penetration is 20 mm-thick cured silicone gel 8 produced in a glass petri dish with a diameter of 70 mm, and the hardening deterioration phenomenon of silicone gel 8 in the power semiconductor device is replicated almost exactly.

Based on the foregoing reason, the needle penetration after high temperature storage has a high correlation with the occurrence of cracking in the temperature cycle test of the power semiconductor device, and the needle penetration after high temperature storage is used as an index of the occurrence of cracking of silicone 8.

The microcrystallization temperature of the cured silicone gel 8 was measured by a differential scanning calorimetry (DSC) (DSC7000x manufactured by Hitachi High-Tech Science Corporation). For the measurement conditions, the temperature was increased from −80° C. to 100° C. under an N2 atmosphere at 3° C./min, and the microcrystallization temperature of the cured silicone gel was obtained from the endothermic peak in the low temperature region.

Cured silicone gel 8 has a property of soft gel at room temperature, but in the low-temperature region, thermal agitation of the silicone chain decreases, and silicone gel 8 is partially microcrystallized. Then, at the microcrystallization temperature or lower, silicone gel 8 is partially microcrystallized into a hard and brittle rubber state, rather than a gel state. Since silicone gel 8 is hard and brittle at the microcrystallization temperature or lower, the use of the power semiconductor device at the microcrystallization temperature or lower may cause cracking of silicone gel 8. Therefore, it is necessary to set the microcrystallization temperature of silicone gel 8 to a temperature equal to lower than the use temperature on the low temperature side (low use temperature) of the power semiconductor device. The use temperature on the low temperature side (low specification temperature) is the minimum value (lower limit) of the use temperatures of the power semiconductor device. Room temperature is usually approximately in the range of 20° C. to 25° C.

The resin strength of the cured silicone gel was determined by a shear adhesion test using an autograph (AG-IS manufactured by SHIMADZU CORPORATION) with a sample having an aluminum plate affixed with the cured silicone gel. The shear adhesion test sample was fabricated by affixing a spacer/dam of 20 mm×40 mm×0.24 mm to an aluminum plate with fluoroplastic tape, applying about 0.5 g of silicone gel 8, and curing silicone gel 8 held with another aluminum plate and fixed with a clip. The measurement was performed at room temperature at a tensile rate of 5 mm/min, and the maximum testing force was determined. The failure mode of the sample after failure was cohesion failure of silicone gel 8. Since the failure mode is cohesion failure of silicone gel 8, this maximum testing force is considered as the resin strength of silicone gel 8.

The reliability was evaluated by conducting a temperature cycle test. The temperature cycle test was conducted using a thermal shock tester. The temperature cycle test was performed 1000 cycles under the conditions: the low temperature side −55° C., the high temperature side 175° C., holding for one hour on each side. After completion of 1000 cycles, the presence/absence of cracks of silicone gel 8 was determined by visual inspection.

The temperature cycle test was conducted using 10 kinds of silicon gels having different resin strengths, microcrystallization temperatures, and needle penetrations after 175° C. high temperature storage.

Figure 2:
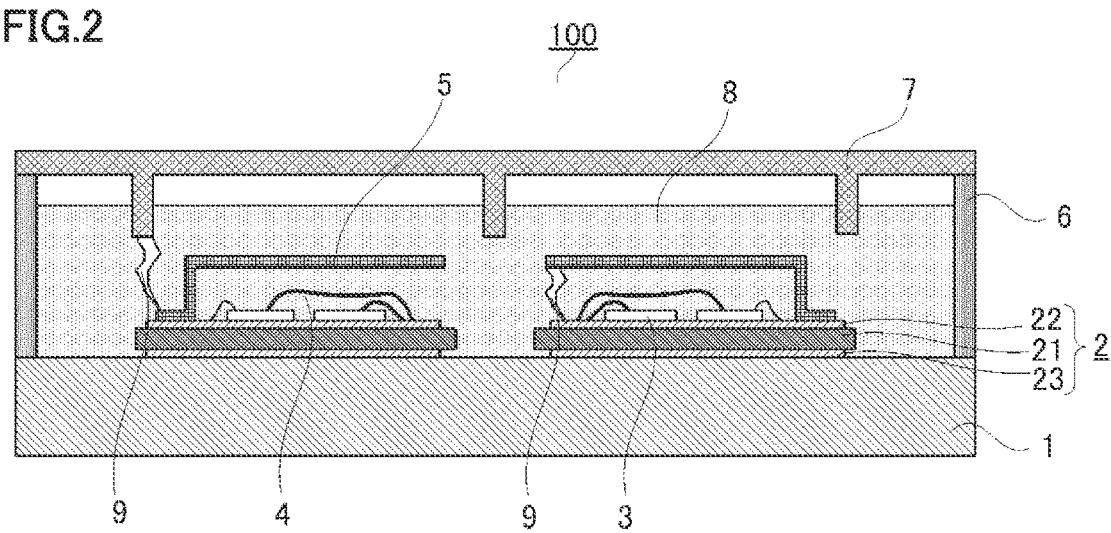
FIG. 2 is a schematic diagram illustrating a cross-sectional structure of a power semiconductor device in which cracking occurs in a silicone gel in a temperature cycle test in the first embodiment of the present invention.

FIG. 2 is a schematic diagram showing a cross-sectional structure of a power semiconductor device in which cracking occurs in a silicone gel in a temperature cycle test in the first embodiment of the present invention. In the figure, power semiconductor device 100 includes a base plate 1 as a metal member, an insulating substrate 2, a chip 3 as a semiconductor element, a bonding wire 4 as a metal wire, a main electrode 5, a case member 6, a cover 7 as a cover member, silicone gel 8 as sealing resin, and a crack 9. As can be seen in the figure, when silicone gel 8 deteriorates through the temperature cycle test, crack 9 originating from the protrusion of cover 7 and an end portion of main electrode 5 is produced in the inside of silicone gel 8. This crack 9 degrades the reliability of power semiconductor device 100.

Table 1 is the prototype specifications of the power semiconductor device using the present embodiment and the temperature cycle test result.

In the temperature cycle test result in Table 1, "○" indicates that no crack was observed in silicone gel 8 after the temperature cycles, and "x" indicates that cracks of silicone gel 8 were observed.

The temperature cycle test result and the characteristic values of resin strength, microcrystallization temperature, and needle penetration after 175° C. high temperature storage were examined, and it has been found that all of the resin strength, the microcrystallization temperature, and the needle penetration after 175° C. high temperature storage have a correlation with the occurrence of cracking of silicone gel 8 in the temperature cycle test. The characteristic values of resin strength, microcrystallization temperature, and needle penetration after 175° C. high temperature storage each have an optimum region, and it has been found that cracking of silicone gel 8 can be prevented in a region where the three optimum regions overlap.

In cases 1 to 10 shown in Table 1, the occurrence of cracking of silicone gel 8 was not observed in any of the needle penetration measurement samples stored at high temperature of 175° C. for 1000 hours. However, in cases 1 to 6 and case 10, cracking occurs in silicone gel 8 in the temperature cycle test. Based on this, it has been found that crack evaluation of silicone gel 8 is stricter in the temperature cycle test, and the optimum region in which cracking is prevented is more restricted in the temperature cycle test than the optimum region in which cracking is prevented in the high temperature storage test.

TABLE 1

|  | Resin strength (MPa) | Microcrystallization temperature (° C.) | Needle penetration after high temperature storage | Temperature cycle test result |
|---|---|---|---|---|
| Case 1 | 0.03 | ≤−55 | 43 | X |
| Case 2 | 0.07 | −52 | 21 | X |
| Case 3 | 0.08 | −52 | 40 | X |
| Case 4 | 0.09 | ≤−55 | 32 | X |
| Case 5 | 0.12 | −52 | 32 | X |
| Case 6 | 0.12 | ≤−55 | 28 | X |
| Case 7 | 0.12 | ≤−55 | 32 | ○ |
| Case 8 | 0.19 | ≤−55 | 40 | ○ |
| Case 9 | 0.40 | ≤−55 | 40 | ○ |
| Case 10 | 0.60 | ≤−55 | 20 | X |

As for the resin strength, 0.12 MPa or higher is the optimum region. As for the microcrystallization temperature, −55° C. or lower is the optimum region. As for the needle penetration after high temperature storage, 30 or more is the optimum region. Cracking of silicone gel 8 in the temperature cycle test can be prevented in cases 7, 8, and 9, in which the characteristic values of these three items are in the optimum regions. The occurrence of cracking of the silicone gel sealing material can be prevented in the temperature cycle of the power semiconductor device, and a reliable power semiconductor device can be obtained.

If the resin strength of silicone gel 8 is insufficient, thermal stress causes cracking in silicone gel 8. The optimum region of the resin strength is 0.12 MPa or higher.

The resin strength of silicone gel 8 can be set to 0.12 MPa or higher by optimizing the chemical structure and the crosslinking density of silicone gel 8. The chemical structure of silicone gel 8 includes a polymer of dimethylsiloxane, and the resin strength can be improved by partially changing this dimethylsiloxane to diphenylsiloxane.

The silicone gel is crosslinked through an addition reaction of the vinyl group of a methylvinylsilixane polymer with a methylhydrogen polymer, where the crosslinking density is preferably from 0.3 to 1.3 mol % in terms of the mole fraction in the polymer of silicone gel 8. When the crosslinking density is lower than 0.3 mol %, the resin strength is insufficient and cracking of silicone gel 8 occurs. When the crosslinking density is higher than 1.3 mol %, silicone gel 8 is hard and brittle, causing cracking of silicone gel 8.

Although a higher resin strength is effective to prevent cracking of silicone gel 8 caused by thermal stress, increasing the resin strength is likely to cause hardening deterioration in high temperature storage, and it is difficult to set the needle penetration to 30 or higher after storage at 175° C. for 1000 hours. Considering the region in which the resin strength and the needle penetration after storage at 175° C. for 1000 hours can be balanced, the upper limit of the resin strength is preferably 0.6 MPa or less.

When silicone gel 8 undergoes thermal hysteresis at 175° C. in a temperature cycle test, silicone gel 8 hardens, that is, hardening deterioration occurs. When hardening deterioration proceeds and silicone gel 8 hardens, silicone gel 8 becomes brittle, causing cracking of silicone gel 8. It has been found that the optimum region of the needle penetration after storage at 175° C. for 1000 hours is 30 or more.

For silicone gel 8 in case 10, the needle penetration before the temperature cycle test was 70, the needle penetration after storage at 175° C. for 1000 hours was 20, and cracking of silicone gel 8 occurred in the temperature cycle test. The reason may be that hardening deterioration of silicone gel 8 proceeded due to the temperature history of the temperature cycle test, silicone gel 8 became brittle, and cracking of silicone gel 8 occurred due to thermal stress in the temperature cycle test. In this way, even when the value of needle penetration of silicone gel 8 before the temperature cycle test is between 70 and 30 or higher, cracking of silicone gel 8 occurs due to the temperature cycle test. Based on the foregoing, it is understood that not the needle penetration of silicone gel 8 at the initial stage but the needle penetration of silicone gel 8 after high temperature storage has a correlation with the occurrence of cracking of silicone gel 8 in the temperature cycle test.

However, if the needle penetration of cured silicone gel 8 is greater than 70, silicone gel 8 is very soft, and therefore, bubbles are likely to be produced in silicone gel 8 when the power semiconductor device undergoes thermal hysteresis. If bubbles are produced in silicone gel 8, the insulation properties of the power semiconductor device are reduced. Therefore, in view of preventing bubbles in the silicone gel, the needle penetration after storage at 175° C. for 1000 hours is preferably 70 or less.

A heat resistance improving agent may be added to the silicone gel so that the needle penetration after 175° C. high temperature storage is set to 30 or more. Examples of the heat resistance improving agent include titanium, cerium, iron, nickel, and other metal complexes, which can be used singly or in combination. In order to prevent change of needle penetration after 175° C. high temperature storage, a cerium complex and an iron complex are preferred.

The property of silicone gel 8 is soft gel at room temperature, but in the low temperature region, thermal agitation of the silicone chain decreases, and silicone gel 8 is partially microcrystallized. At the microcrystallization temperature or lower, silicone gel 8 is partially microcrystallized into a hard and brittle rubber state, rather than a gel state. Since silicone gel 8 is hard and brittle at the microcrystallization temperature or lower, the use of the power semiconductor device at the microcrystallization temperature or lower may lead to the occurrence of cracking of silicone gel 8. Since the temperature on the low temperature side of the temperature cycle test is −55° C., the microcrystallization temperature has an optimum region equal to or lower than −55° C.

The microcrystallization temperature can be set to −55° C. or lower by optimizing the chemical structure of silicone gel 8. The chemical structure of silicone gel 8 includes a polymer of dimethylsiloxane, and this dimethylsiloxane is partially changed to diphenylsiloxane, so that the silicone gel polymer is unable to be aligned regularly due to steric hindrance of the phenyl group in a low temperature state. The microcrystallization temperature thus can be set to −55° C. or lower without generating microcrystals even at low temperatures.

The ratio of diphenylsiloxane is preferably from 4 mol % to 10 mol % in terms of the mole ratio of the silicone gel polymer. If less than 4 mol % in terms of the mole ratio of the silicone gel polymer, the effect of suppressing microcrystallization by steric hindrance of the phenyl group is small, and the microcrystallization temperature is unable to be set to −55° C. or lower. If the ratio of diphenylsiloxane is greater than 10 mol %, the material cost is increased and not cost-effective.

In power semiconductor device 100 configured as described above, the physical property values of silicone gel 8 are set such that the resin strength at room temperature is 0.12 MPa or higher, the microcrystallization temperature is −55° C. or lower, and the needle penetration after high temperature storage is 30 or more. This setting can prevent cracking of silicone gel 8 in the temperature cycles and can provide a reliable power semiconductor device.

Second Embodiment

A second embodiment differs from the first embodiment in that two insulating substrates 2 each having a size of 5 cm×4 cm are bonded to base plate 1 with an outer diameter of 14 cm×10 cm, and case 6 having a height of 4 cm is sealed with silicone gel 8 having a thickness of 2 cm. Such a configuration also can improve the reliability of power semiconductor device 100.

Table 2 shows the prototype specifications of the power semiconductor device using the present embodiment and the temperature cycle test result.

In the temperature cycle test result in Table 2, "○" indicates that no crack was observed in silicone gel 8 after the temperature cycles, and "x" indicates that cracks of silicone gel 8 were observed.

TABLE 2

|  | Resin strength (MPa) | Microcrystallization temperature (° C.) | Needle penetration after high temperature storage | Temperature cycle test result |
| --- | --- | --- | --- | --- |
| Case 11 | 0.03 | ≤−55 | 43 | X |
| Case 12 | 0.07 | −52 | 21 | X |
| Case 13 | 0.08 | −52 | 40 | X |
| Case 14 | 0.09 | ≤−55 | 32 | X |
| Case 15 | 0.12 | −52 | 32 | X |
| Case 16 | 0.12 | ≤−55 | 28 | X |
| Case 17 | 0.12 | ≤−55 | 32 | ○ |
| Case 18 | 0.19 | ≤−55 | 40 | ○ |
| Case 19 | 0.40 | ≤−55 | 40 | ○ |
| Case 20 | 0.60 | ≤−55 | 20 | X |

The temperature cycle test result and the characteristic values of resin strength, microcrystallization temperature, and needle penetration after 175° C. high temperature storage were examined, and it has been found that all of the resin strength, the microcrystallization temperature, and the needle penetration after 175° C. high temperature storage have a correlation with the occurrence of cracking of silicone gel 8 in the temperature cycle test. The characteristic values of resin strength, microcrystallization temperature, and needle penetration after 175° C. high temperature storage each have an optimum region, and it has been found that cracking of silicone gel 8 can be prevented in a region where the three optimum regions overlap.

As for the resin strength, 0.12 MPa or higher is the optimum region. As for the microcrystallization temperature, −55° C. or lower is the optimum region. As for the needle penetration after high temperature storage, 30 or more is the optimum region. Cracking of silicone gel 8 in the temperature cycle test can be prevented in cases 17, 18, and 19, in which the characteristic values of the three items fall in the optimum region. The occurrence of cracking of silicone gel 8 sealing material can be prevented in the temperature cycles of the power semiconductor device 100, and a reliable power semiconductor device can be obtained.

In power semiconductor device 100 configured as described above, the physical property values of silicone gel 8 are set such that the resin strength at room temperature is 0.12 MPa or higher, the microcrystallization temperature is −55° C. or lower, and the needle penetration after high temperature storage is 30 or more. This setting can prevent cracking of silicone gel 8 in the temperature cycles and can provide a reliable power semiconductor device.

Third Embodiment

A third embodiment differs from the second embodiment in that base plate 1 is replaced by a cooler 10. Since cooler 10 is directly bonded to the power semiconductor device, the heat resistance is small, the heat dissipation is improved, and the reliability is improved.

Figure 3:
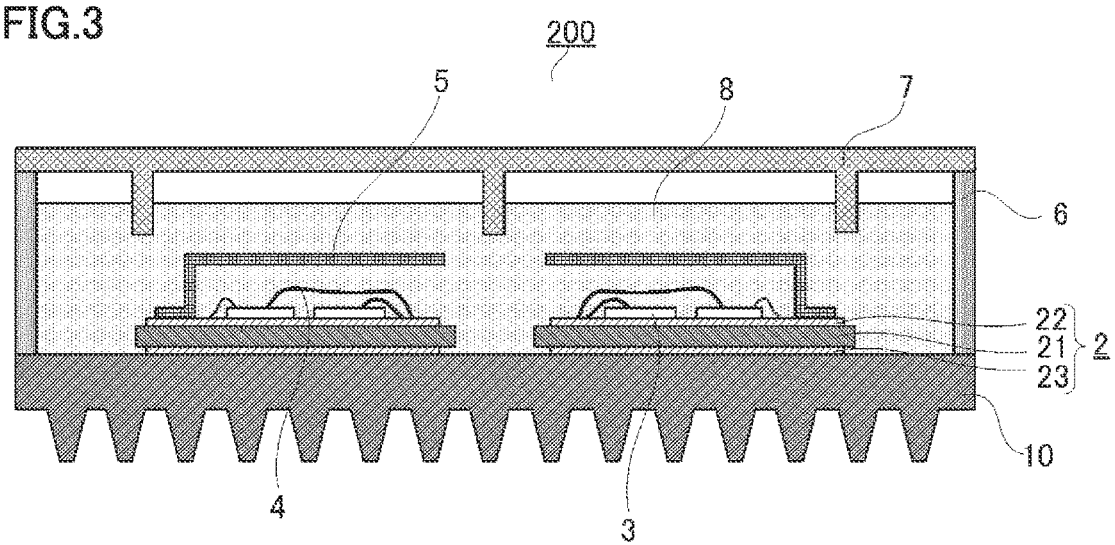
FIG. 3 is a schematic diagram illustrating a cross-sectional structure of a power semiconductor device in a third embodiment of the present invention.

FIG. 3 is a schematic diagram illustrating a cross-sectional structure of a power semiconductor device in the third embodiment of the present invention. In the figure, a power semiconductor device 200 includes an insulating substrate 2, a chip 3 as a semiconductor element, a bonding wire 4 as a metal wire, a main electrode 5, a case member 6, a cover 7 as a cover member, silicone gel 8 as sealing resin, and a cooler 10 as a metal member.

For example, aluminum and aluminum alloy, copper and copper alloy, and a composite material of aluminum and ceramics, such as AlSiC, can be used for cooler 10. Specifically, aluminum and aluminum alloy are preferred in terms of thermal conductivity, processability, and light weight.

Table 3 shows the prototype specifications of the power semiconductor device using the present embodiment and the temperature cycle test result.

In the temperature cycle test result in Table 3, "○" indicates that no crack was observed in silicone gel 8 after the temperature cycles, and "x" indicates that cracks of silicone gel 8 were observed.

TABLE 3

|  | Resin strength (MPa) | Microcrystallization temperature (° C.) | Needle penetration after high temperature storage | Temperature cycle test result |
| --- | --- | --- | --- | --- |
| Case 21 | 0.03 | ≤−55 | 43 | X |
| Case 22 | 0.07 | −52 | 21 | X |
| Case 23 | 0.08 | −52 | 40 | X |
| Case 24 | 0.09 | ≤−55 | 32 | X |
| Case 25 | 0.12 | −52 | 32 | X |
| Case 26 | 0.12 | ≤−55 | 28 | X |
| Case 27 | 0.12 | ≤−55 | 32 | ○ |
| Case 28 | 0.19 | ≤−55 | 40 | ○ |
| Case 29 | 0.40 | ≤−55 | 40 | ○ |
| Case 30 | 0.60 | ≤−55 | 20 | X |

The temperature cycle test result and the characteristic values of resin strength, microcrystallization temperature, and needle penetration after 175° C. high temperature storage were examined, and it has been found that all of the resin strength, the microcrystallization temperature, the needle penetration after 175° C. high temperature storage have a correlation with the occurrence of cracking of silicone gel 8 in the temperature cycle test. The characteristic values of resin strength, microcrystallization temperature, and needle penetration after 175° C. high temperature storage each have an optimum region, and it has been found that cracking of silicone gel 8 can be prevented in a region where the three optimum regions overlap.

As for the resin strength, 0.12 MPa or higher is the optimum region. As for the microcrystallization temperature, −55° C. or lower is the optimum region. As for the needle penetration after high temperature storage, 30 or more is the optimum region. Cracking of silicone gel 8 in the temperature cycle test can be prevented in cases 27, 28, and 29, in which the characteristic values of these three items fall in the optimum region.

In power semiconductor device 200 configured as described above, the physical property values of silicone gel 8 are set such that the resin strength at room temperature is 0.12 MPa or higher, the microcrystallization temperature is −55° C. or lower, and the needle penetration after high temperature storage is 30 or more. This setting can prevent cracking of silicone gel 8 in the temperature cycles and can provide a reliable power semiconductor device.

DESCRIPTION OF THE REFERENCE SIGNS

1 base plate, 2 insulating substrate, 3 chip, 4 bonding wire, 5 main electrode, 6 case, 7 cover, 8 silicone gel, 9 silicone gel crack, 10 cooler, 21 ceramic plate, 22, 23 conductor layer, 100, 200 power semiconductor device.

The invention claimed is:

1. A power semiconductor device comprising:
an insulating substrate having a metal layer which is formed on an upper surface of said insulating substrate;
a semiconductor element and a main electrode each bonded to an upper surface of said metal layer;
a metal ware connecting said metal layer and said semiconductor element;
a metal member bonded to a lower surface side of said insulating substrate;
a case member surrounding said insulating substrate and affixed to said metal member; and
a sealing resin filled in a region surrounded by said metal member and said case member, said sealing resin having a resin strength equal to or higher than 0.12 MPa at room temperature, a microcrystallization temperature equal to or lower than −55° C. and a needle penetration of 30 to 50 after storage at 175° C. for 1000 hours, said sealing resin sealing said insulating substrate, said metal layer, said semiconductor element, said metal wire, and said main electrode.

2. The power semiconductor device according to claim 1, wherein said sealing resin is a silicone gel in which a ratio of diphenylsiloxane is 4 mol % to 10 mol % in terms of mole fraction in said sealing resin, a crosslinking density by an addition reaction of vinyl group of methylvinylsiloxane and methylhydrogensiloxane is 0.3 mol % to 1.3 mol % in terms of mole fraction in said sealing resin, and a heat resistance improving agent of an iron complex is blended.

3. The power semiconductor device according to claim 2, wherein said metal member is a cooler having a cooling fin.

4. The power semiconductor device according to claim 3, further comprising a cover member covering an upper surface of said sealing resin, said cover member having a protrusion inserted in said sealing resin, said cover member being fixed to said case member.

5. The power semiconductor device according to claim 2, wherein a plurality of said insulating substrates are bonded to a base plate as said metal member, and said insulating substrates are collectively surrounded by said case member.

6. The power semiconductor device according to claim 5, further comprising a cover member covering an upper surface of said sealing resin, said cover member having a protrusion inserted in said sealing resin, said cover member being fixed to said case member.

7. The power semiconductor device according to claim 2, further comprising a cover member covering an upper surface of said sealing resin, said cover member having a protrusion inserted in said sealing resin, said cover member being fixed to said case member.

8. The power semiconductor device according to claim 1, wherein said metal member is a cooler having a cooling fin.

9. The power semiconductor device according to claim 8, wherein a plurality of said insulating substrates are bonded to a base plate as said metal member, and said insulating substrates are collectively surrounded by said case member.

10. The power semiconductor device according to claim 9, further comprising a cover member covering an upper surface of said sealing resin, said cover member having a protrusion inserted in said sealing resin, said cover member being fixed to said case member.

11. The power semiconductor device according to claim 8, further comprising a cover member covering an upper surface of said sealing resin, said cover member having a protrusion inserted in said sealing resin, said cover member being fixed to said case member.

12. The power semiconductor device according to claim 1, wherein a plurality of said insulating substrates are bonded to a base plate as said metal member, and said insulating substrates are collectively surrounded by said case member.

13. The power semiconductor device according to claim 12, further comprising a cover member covering an upper surface of said sealing resin, said cover member having a protrusion inserted in said sealing resin, said cover member being fixed to said case member.

14. The power semiconductor device according to claim 1, further comprising a cover member covering an upper surface of said sealing resin, said cover member having a protrusion inserted in said sealing resin, said cover member being fixed to said case member.

15. The power semiconductor device according to claim 14, further comprising a cover member covering an upper surface of said sealing resin, said cover member having a protrusion inserted in said sealing resin, said cover member being fixed to said case member.

* * * * *